(12) United States Patent
Winer et al.

(10) Patent No.: US 6,528,895 B2
(45) Date of Patent: Mar. 4, 2003

(54) METHOD AND APPARATUS FOR MAKING AND USING AN IMPROVED FIDUCIAL FOR AN INTEGRATED CIRCUIT

(75) Inventors: Paul Winer, Santa Clara, CA (US); Richard Livengood, Los Gatos, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/968,099

(22) Filed: Sep. 28, 2001

(65) Prior Publication Data

US 2002/0030805 A1 Mar. 14, 2002

Related U.S. Application Data

(62) Division of application No. 09/451,631, filed on Nov. 30, 1999.

(51) Int. Cl.[7] ............................................. H01L 23/544
(52) U.S. Cl. ........................................ 257/797; 257/798
(58) Field of Search .................................. 257/797, 798; 356/399, 400; 438/401

(56) References Cited

U.S. PATENT DOCUMENTS

| 5,497,033 | A |   | 3/1996  | Fillion et al. ............... 257/723 |
| 5,940,545 | A |   | 8/1999  | Kash et al. .................. 382/312 |
| 5,942,805 | A | * | 8/1999  | Winer et al. ................. 257/797 |
| 5,948,466 | A | * | 9/1999  | Sarashina et al. ............ 257/797 |
| 5,963,781 | A |   | 10/1999 | Winer ........................... 438/14 |
| 6,287,876 | B1 | * | 9/2001 | Fujiwara ..................... 257/797 |

OTHER PUBLICATIONS

US 6,304,668, 10/2001, Evans et al. (withdrawn)

* cited by examiner

Primary Examiner—Phat X. Cao
(74) Attorney, Agent, or Firm—Blakely, Sokoloff, Taylor & Zafman LLP

(57) ABSTRACT

In one embodiment, the present invention includes a method including the following acts. A light source is scanned over a surface of an integrated circuit. A photo-induced current is measured from a fiducial in the integrated circuit. The current is correlated to a position of the light source as the scanning progresses.

10 Claims, 9 Drawing Sheets

METHOD AND APPARATUS FOR MAKING AND USING AN IMPROVED FIDUCIAL FOR AN INTEGRATED CIRCUIT

The present patent application is a Divisional of prior application Ser. No. 09/451,631, filed Nov. 30, 1999, entitled "Method And Apparatus For Making And Using An Improved Fiducial For An Integrated Circuit."

BACKGROUND OF THE INVENTION

1. Field of the Invention

The invention is generally related to integrated circuits and more specifically to integrated circuit processing, design, and debugging.

2. Description of the Related Art

Prior art fiducials have typically been produced with a single layer or multiple layers of metals deposited on a semiconductor substrate in a characteristic shape, such as a cross or plus-sign ('+') shape, or some similar but recognizable shape. By using a recognizable shape, these fiducials have been constrained to be large patterns which prove distinctive when viewed by the people who use them for navigating on a semiconductor integrated circuit. A fiducial in the prior art would often consume a square-shaped space on the integrated circuit 150 μm on a side, which could only be used for the fiducial, not for any active circuitry. As a result, valuable resources on the integrated circuit would be unavailable in that region.

FIG. 1 illustrates one prior art scheme for placement of fiducials. Package 1 10 contains integrated circuit 130. Package 110 also have four package fiducials 120 located on the outside of package 110, which are used by someone who needs to locate a specific portion of integrated circuit 130. After locating and aligning to a first package fiducial 120, a portion of the package 110 may be removed to expose integrated circuit 130. Each of four fiducials 140 are incorporated into integrated circuit 130. Upon aligning to a first fiducial 140, a person may then navigate over the integrated circuit 130 by looking at a layout diagram of integrated circuit 130 which shows the location of the fiducials 140 relative to the circuitry incorporated in integrated circuit 130.

As will be appreciated, positioning the fiducials such as fiducials 140 proves difficult due to constraints on available space on integrated circuit 130. In the case of a fiducial consuming a square of space 150 μm on a side, four such squares must be reserved in the area available on integrated circuit 130, and no other signals may be routed in those reserved areas. In some prior art processes, the fiducial must be deposited in every significant layer of deposition in the semiconductor fabrication process.

Furthermore, even in situations in which automated alignment equipment is used, such equipment must use an optical system for locating the fiducials. Whether human, mechanical, or some combination of human and mechanical, the optical systems are limited by their inability to resolve images below a certain size (length or area) threshold on semiconductor devices. This limitation leads to a limitation on the size of fiducials used for alignment when using optical alignment systems, thus leading to the 150 μm length of prior art fiducials. It will be appreciated that even though an optical system may be capable of resolving features much smaller than the overall size of a fiducial, that the need for a distinctive shape of the fiducial leads to a fiducial much larger than the size of the smallest feature an optical system may resolve.

SUMMARY OF THE INVENTION

In one embodiment, the invention includes a method. The method includes scanning a light source over a surface of an integrated circuit. The method also includes measuring a photo-induced current from a fiducial in the integrated circuit. The method also includes correlating the current to a position of the light source as the scanning progresses.

BRIEF DESCRIPTION OF THE DRAWINGS

The present invention is illustrated by way of example and not limitation in the accompanying figures.

DETAILED DESCRIPTION

A method and apparatus for making and using an improved fiducial for an integrated circuit is described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, but the various embodiments may not be construed as mutually exclusive, either.

Figure 2:
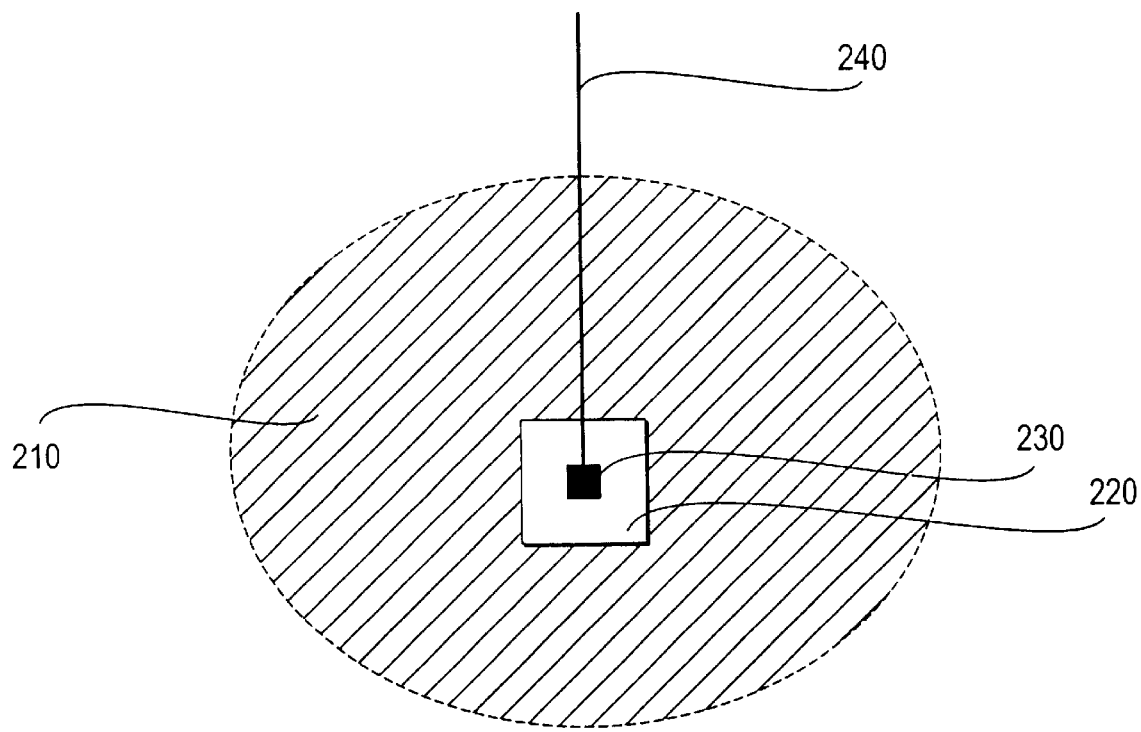
FIG. 2 illustrates an embodiment of a fiducial.

Illustrated in FIG. 2 is one embodiment of a fiducial suitable for use in finding portions of an integrated circuit. Substrate 210, in one embodiment, is a silicon substrate with a light p-type doping. Implant area 220 is a portion of the silicon substrate in which an n-type dopant has been introduced to produce a local n-type well or field. The junction between substrate 210 and implant area 220 forms a pn junction. Substrate 210 may be thought of as having a dopant of a first type and Implant area 220 may be thought of as having a dopant of a second type. Connected or coupled to implant area 220 is contact 230, and coupled to contact 230 is conductor 240. Not shown is the coupling of conductor 240 to a bond pad or other portion of the silicon substrate which may be used to observe the voltage level of conductor 240 or current flowing through conductor 240.

Figure 3:
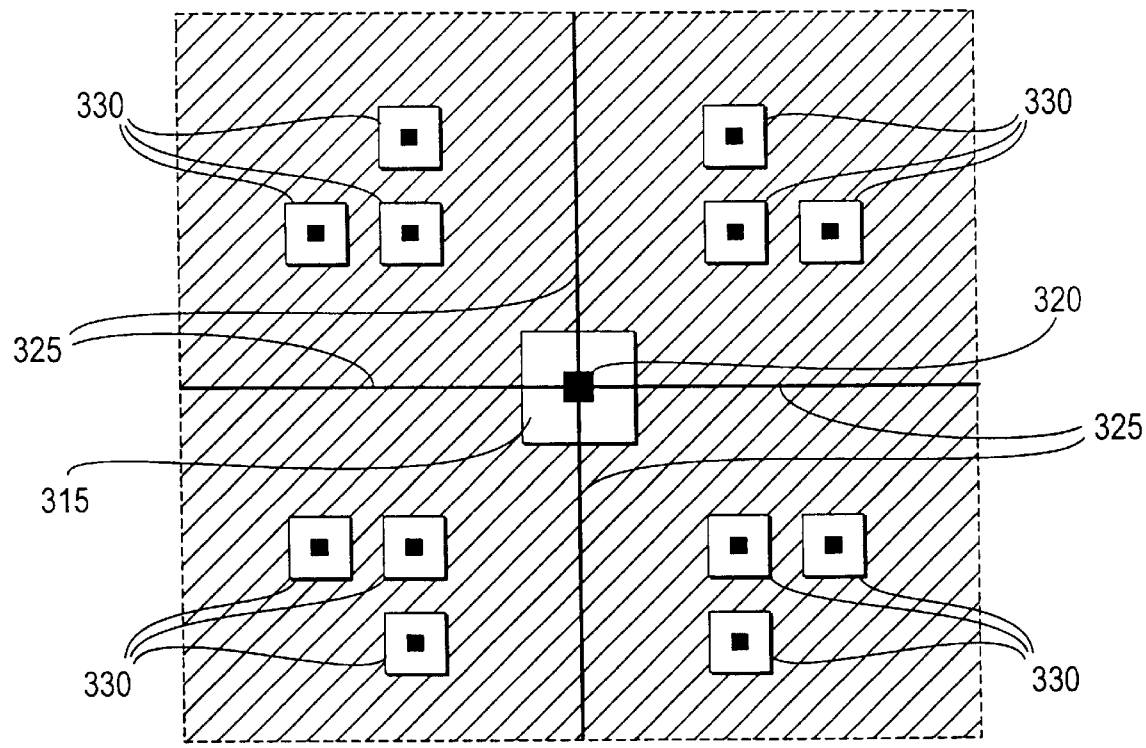
FIG. 3 illustrates an alternate embodiment of a fiducial.

Turning to FIG. 3, another embodiment of a fiducial is illustrated. Again, substrate 310 is a p-type silicon substrate, and implant area 315 is an area doped with an n-type dopant, thus forming a pn junction. Furthermore, contact 320 is connected to implant area 315, and contact 320 couples to conductors 325. Additionally, alignment features 330 are also included.

Figure 4:
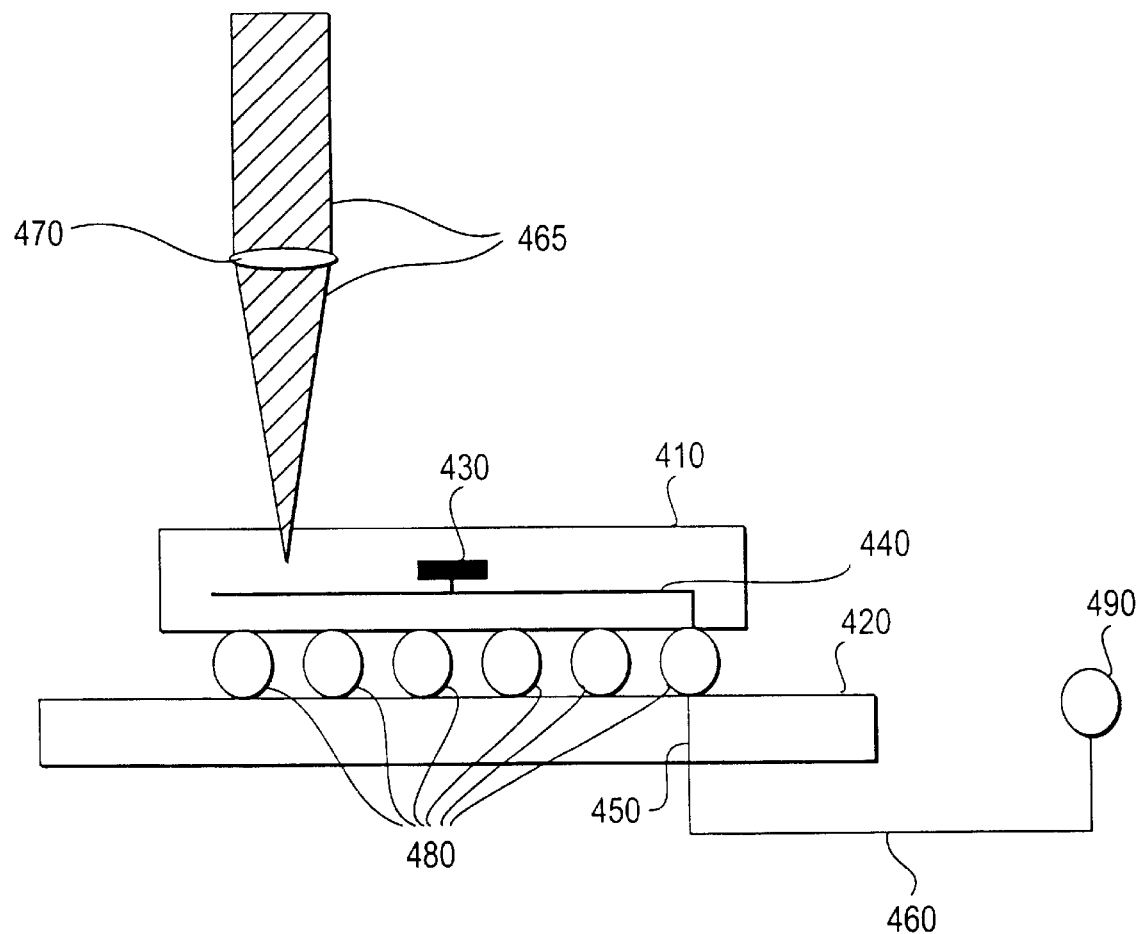
FIG. 4 illustrates a side view of a fiducial in a packaged integrated circuit as it may be scanned by a light beam.

Turning to FIG. 4, use of a fiducial is illustrated. Substrate 410 is a flip-chip or C4-mounted integrated circuit (C4 is an abbreviation for 'Controlled Collapse Chip Connection). At a variety of bond pads on Substrate 410, solder balls 480 are connected to substrate 410. Connected to solder balls 480 is package 420. Conductor 450 connects or couples a first solder ball 480 to lead 460, which in turn connects or couples to sensor 490. Sensor 490 may alternately be a voltage or current sensor. Within Substrate 410, conductor 440 couples the first solder ball 480 to fiducial 430. In one embodiment, fiducial 430 encompasses the implant area 220 and contact 230, while conductor 240 may be conductor 440 and substrate 210 may be substrate 410. Using light beam 465 as focused by lens 470, light is scanned across substrate 410.

Silicon and most other semiconductors are relatively transparent to light in the infrared part of the spectrum, but experimentation indicates that light in the spectrum from the near-visible infrared through the visible spectrum is suitable for use with the fiducial. In one experiment, light at the 514 nm wavelength was found to be useful with the fiducial, and experimentation also indicates that light in the infrared spectrum far removed from the visible spectrum is less useful with the fiducial. Light scanned across the substrate may come from such light sources as a continuous light beam, a strobed light beam, a polychromatic or a monochromatic source, among others.

Figure 5:
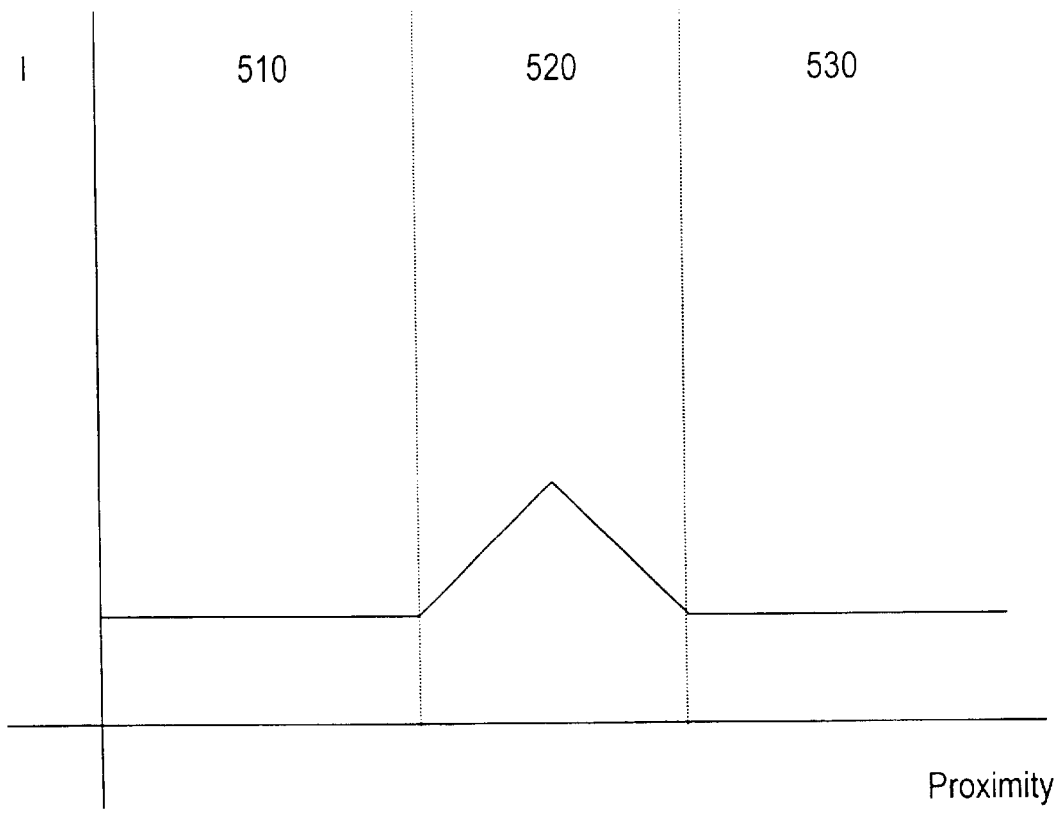
FIG. 5 illustrates a current response of one embodiment of a fiducial when a light beam scans over the area of the fiducial.

As a result, light beam 465 or the photons embodied therein may be projected into substrate 410. When light beam 465 interacts with fiducial 430, a photo-induced current results, which may be measured by sensor 490. Thus, an observer may scan the light beam 465 across the back side surface of substrate 410, and note the location of fiducials 430 based on the current indicated by sensor 490 when the light beam 465 is at projected at various locations on substrate 410. FIG. 5 illustrates a typical response curve for a sensor such as sensor 490, in which the measured current I is plotted against proximity to fiducial 430. In the region 510 and region 530, the light beam 465 is far enough from fiducial 430 that essentially no photo-induced current is measured by sensor 490. However, in region 520, light beam 465 is close enough to fiducial 430 that a photo-induced current is measured by sensor 490, with that current peaking when light beam 465 fully overlaps fiducial 430.

Figure 1:
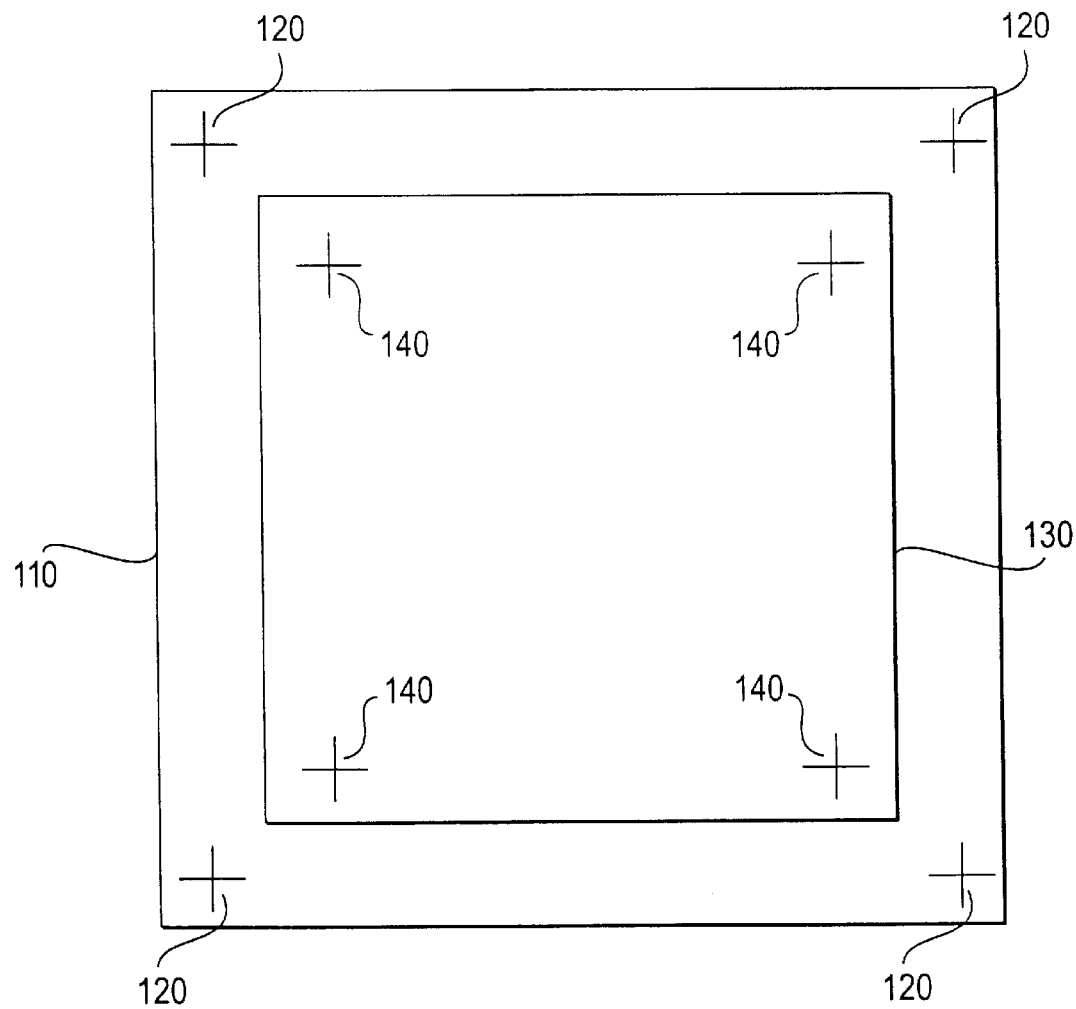
FIG. 1 illustrates a prior art block diagram of fiducials on a packaged integrated circuit.

A fiducial designed to be used in this manner may be designed to be much smaller than the prior art fiducials illustrated in FIG. 1. Experiments with one embodiment of a fiducial as described have shown that a fiducial in which the implant area such as implant area 315 or implant area 220 is formed as a square of length 15 µm per side allows for finely tuned navigation to other features on the integrated circuit as predicted by layout diagrams corresponding to the manufacturing processes for the integrated circuit. In one instance, navigation within 0.1 µm of the actual location of other features on the die was demonstrated, based solely on navigating from the fiducials. Moreover, such experiments indicate that the size of such a fiducial may be further reduced, as photo-induced currents on the order of 1 mA may be produced with a 15 µm square as described above, while currents of significantly lower magnitude may be detected reliably in such situations. Also, it will be appreciated that varying the amount of energy carried by the light beam used for scanning, such as light beam 465, may result in variations in the magnitude of the photo-induced current, such that smaller fiducials may be used with light sources of higher intensity or power.

Figure 6:
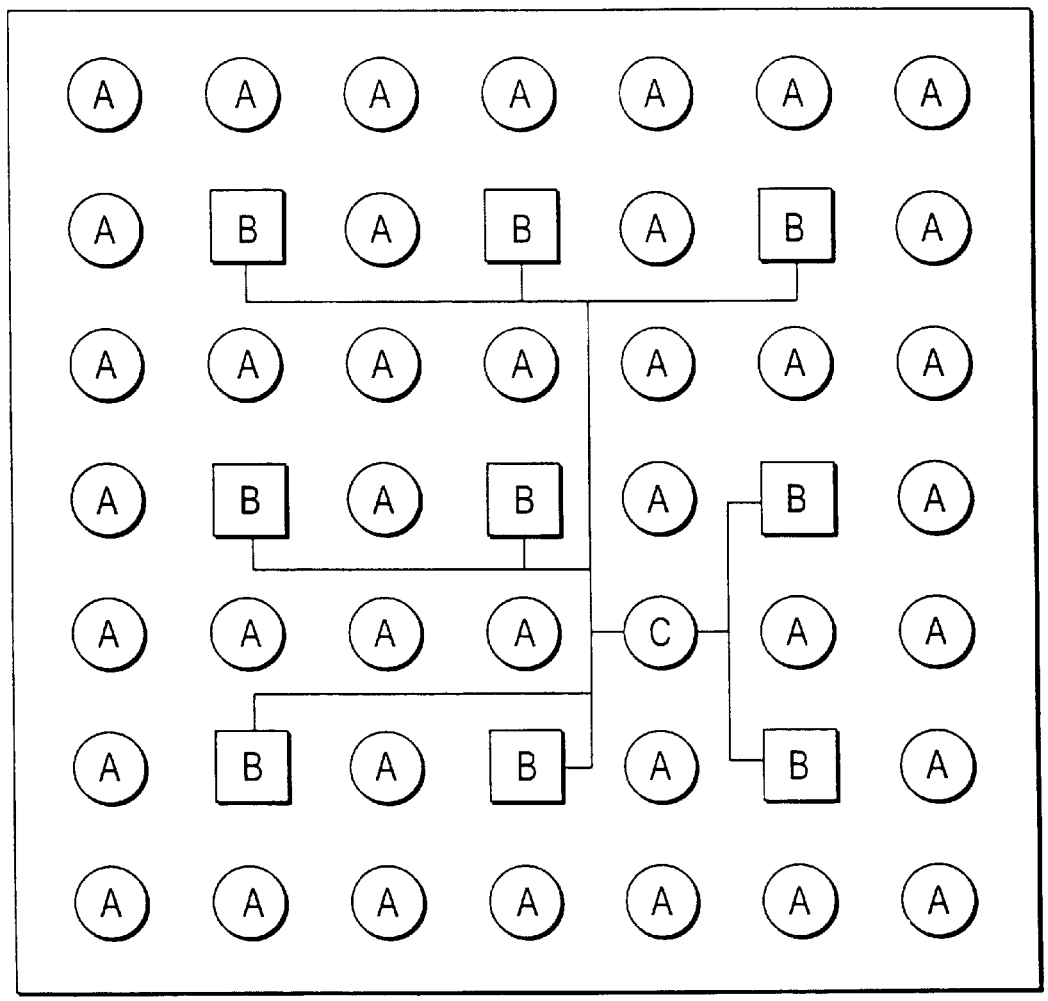
FIG. 6 illustrates a configuration of fiducials and bond pads on an integrated circuit.

Turning to FIG. 6, one embodiment of an integrated circuit containing fiducials such as those described in relation to FIGS. 2 and 3 is illustrated. Bond pads A are spaced at regular intervals throughout the semiconductor substrate. Likewise, fiducials B are also spaced at regular intervals throughout the substrate. One bond pad, bond pad C, is electrically coupled to all of the fiducials B, such that a photo-induced current from any fiducial may be measured by a sensor coupled to bond pad C. It will be appreciated that FIG. 6 illustrates a block diagram, and that locations and connections therein are not scaled relative to each other. For instance, Bond pads A are typically squareshaped in conventional semiconductor technologies, but may be formed in any shape desired. Likewise, the relative sizes of Bond pads A and C and fiducials B are not illustrated, as fiducials B may be sized to be significantly smaller than Bond pads A and C. It will be appreciated that more fiducials B may be positioned on a substrate than the nine illustrated in FIG. 6, particularly since the fiducials B may be made small enough to fit between other circuitry embodied in an integrated circuit.

Figure 7:
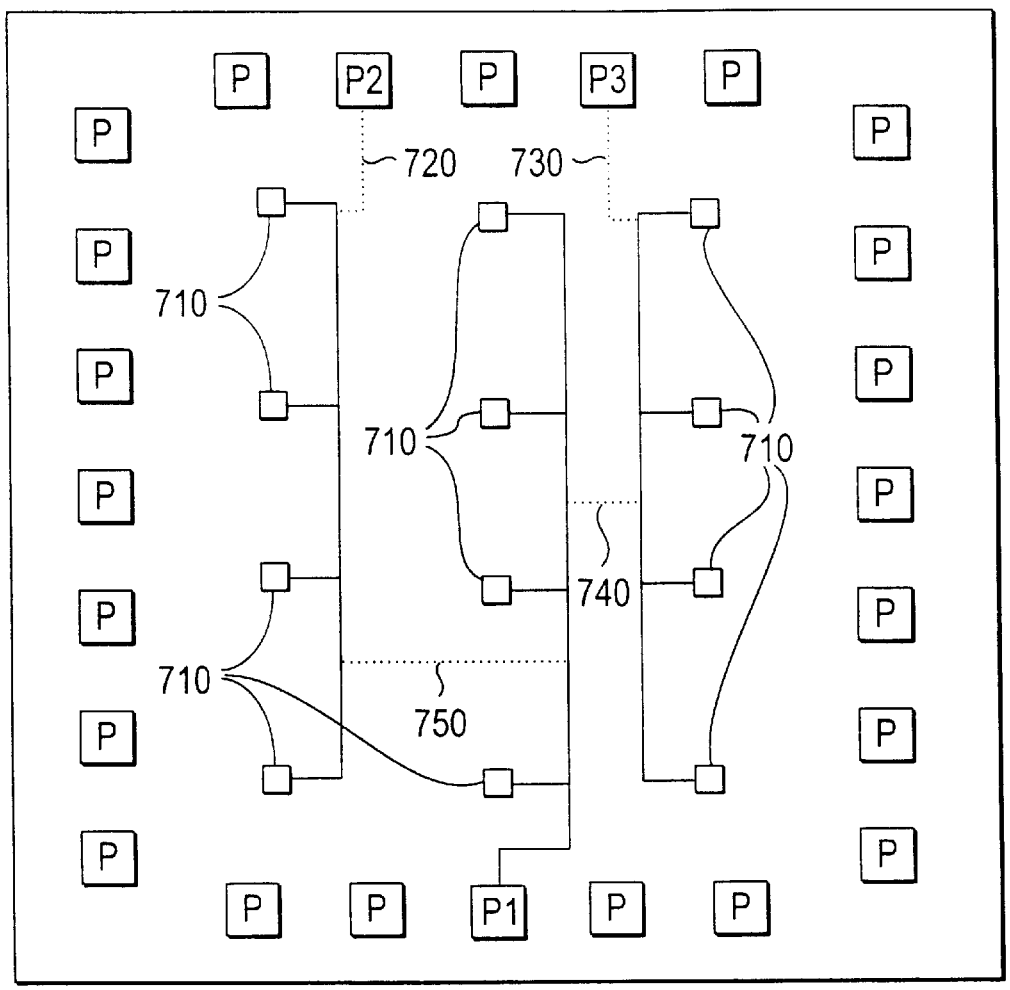
FIG. 7 illustrates an alternative configuration of fiducials on an integrated circuit.

Alternatively, FIG. 7 illustrates another embodiment of an integrated circuit containing fiducials as described in relation to FIGS. 2 and 3. Bond Pads P are located on the perimeter of the integrated circuit. Fiducials 710 are distributed throughout the surface of the substrate in the integrated circuit. In one embodiment, a first set of four fiducials 710 are coupled together to bond pad P1, a second set of four fiducials 710 are coupled through conductor 720 to bond pad P2, and a third set of four fiducials 710 are coupled through conductor 730 to bond pad P3. Thus, some indication of which fiducial is being scanned by a light beam may be derived from analysis of which bond pad P is receiving the photo-induced current. In an alternate embodiment, the second set of fiducials is not coupled to bond pad P2 through conductor 720, but to the first set of fiducials through conductor 750. Likewise, the third set of fiducials is coupled to the first set of fiducials through conductor 740. Thus, all of the fiducials are coupled to common bond pad P1, and one bond pad may be monitored to observe photoinduced current from any of the fiducials. This bond pad may be dedicated for use only in conjunction with the fiducials, or may be used for other purposes when the circuit is in use, such as power supply (Vcc) for example.

Figure 8:
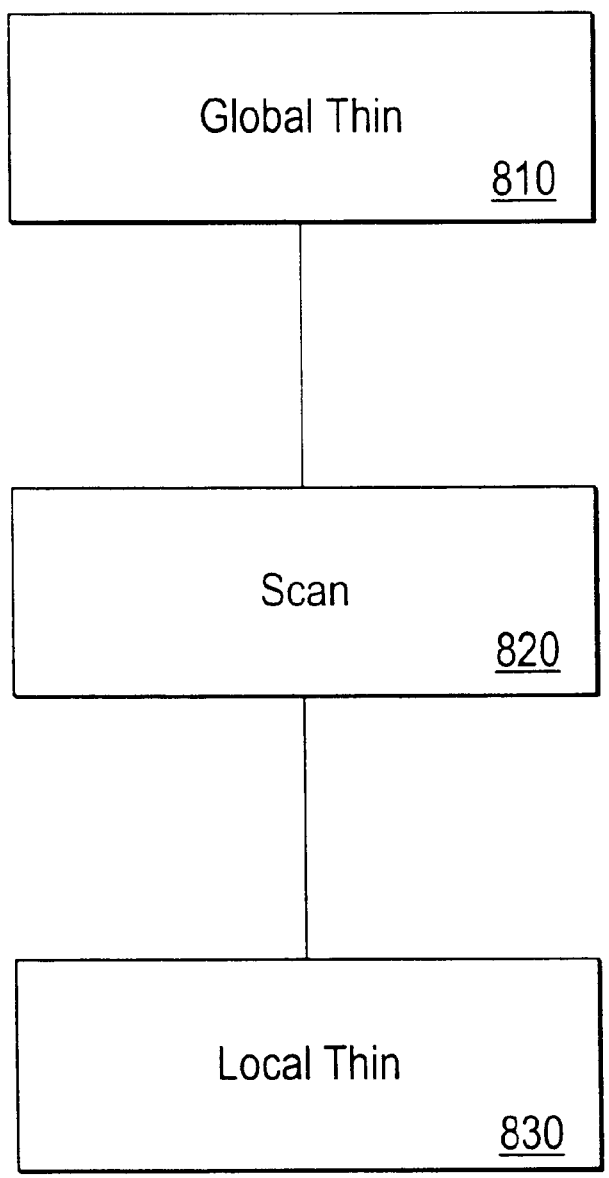
FIG. 8 provides a block diagram of a method of using a fiducial.

Turning to FIG. 8, a flow diagram of one embodiment of a method of using the fiducials described in relation to FIGS. 2 and 3 is illustrated. Initially, the substrate of the semiconductor is thinned globally in Global Thin 810, making it more transparent to light. Scan 820 encompasses scanning a light source or optical source over a surface, and measuring the photo-induced currents produced when the light passes over the fiducials, thus deriving a rough map of a portion or of the entire substrate. Next, the substrate is thinned again in the areas of interest, either at the fiducials or at locations derived from the observed locations of the fiducials at Local Thin 830. At this point, actual debugging of the integrated circuit or other profiling of the substrate.

Figure 9:
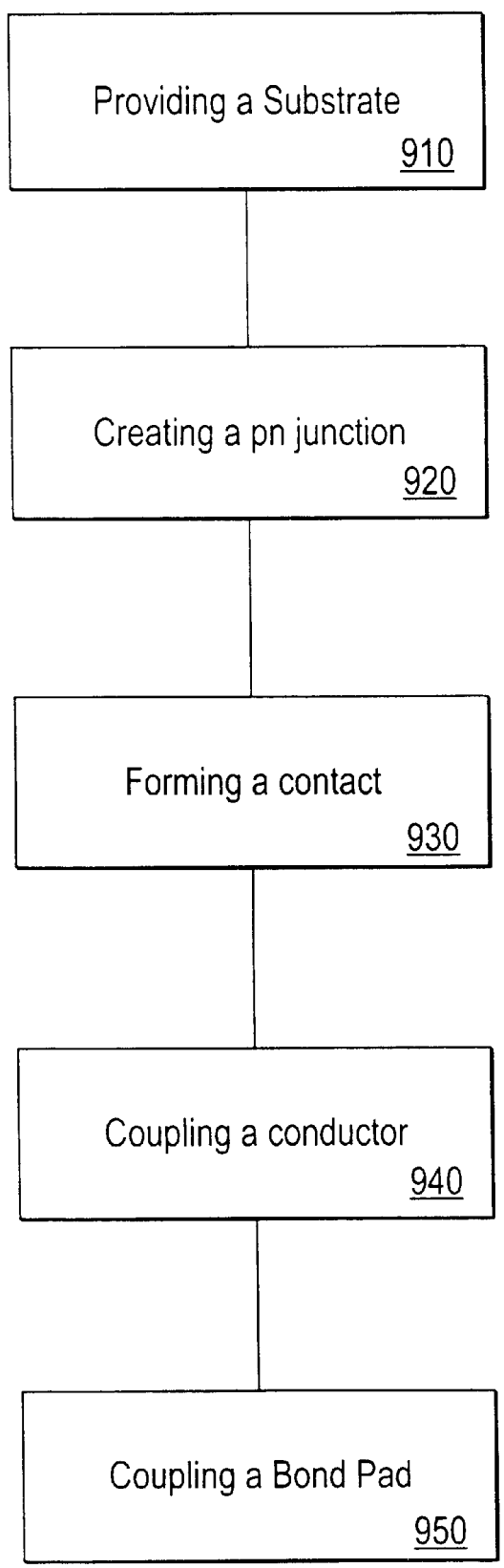
FIG. 9 provides a block diagram of a method of making a fiducial.

Turning to FIG. 9, a flow diagram of how a fiducial may be made in one embodiment is provided. The method of making the fiducial may be described with reference also to FIG. 2. Initially, Providing a Substrate 910 occurs, in which a substrate such as the substrate 210 of FIG. 2 is provided. Following that, a pn junction is created, at Creating a pn Junction 920. One example of creating a pn junction is illustrated by implanting a n-type dopant into a p-type doped substrate, such as may occur to create implant area 220. Next, Forming a Contact 930 occurs, in which a contact to the pn junction such as contact 230 is formed. Next, Coupling a Conductor 940 occurs, in which a conductor such as conductor 240 is couple to the contact, such as contact 230, thereby allowing for an electrical signal to flow to and from the pn junction. Finally, Coupling a Bond Pad 950 occurs, in which the conductor is couple to a bond pad, thereby allowing for probing of the electrical signals flowing to and from the pn junction. It will be appreciated that the method may encompass more or less than exactly what is outlined here. For instance, probing of the pn junction may occur at the contact, thus making the conductor and bond pad less important or unnecessary. Furthermore, the method may also encompass bonding out the bond pad to a wire in a package, thus allowing for access to the signals from outside a packaged integrated circuit.

In the foregoing detailed description, the method and apparatus of the present invention has been described with reference to specific exemplary embodiments thereof. It will, however, be evident that various modifications and changes may be made thereto without departing from the broader spirit and scope of the present invention. For example, the exemplary embodiments have been discussed with respect to a pn junction formed in silicon, but a similar junction formed in Gallium-Arsenide or other semiconducting materials may be used to form a fiducial in such a semiconductor within the spirit and scope of the present invention. Likewise, it will be appreciate that using a fiducial on a integrated circuit which is wire-bonded or otherwise connected to a package that does not use C4 technology may be accomplished within the spirit and scope of the present invention. The present specification and figures are accordingly to be regarded as illustrative rather than restrictive.

What is claimed is:

1. An apparatus comprising:
    a fiducial in an integrated circuit including:
    a substrate with a first dopant concentration of a first type;
    a doped portion of the substrate having a second dopant concentration of a second type, the second dopant concentration greater than the first dopant concentration, the second type different from the first type, such that a junction of the doped portion of the substrate with the substrate forms a pn junction; and
    a contact coupled to the doped portion of the substrate, the contact accessible electrically outside of the integrated circuit.

2. The apparatus of claim 1 wherein:
the substrate is a silicon substrate.

3. The apparatus of claim 2 wherein:
the first type is p-type and the second type is n-type.

4. The apparatus of claim 3 further comprising:
a bond pad, the bond pad coupled to the contact;
a package, the package enclosing the substrate, the package having a plurality of leads, a lead of the plurality of leads coupled to the bond pad.

5. The apparatus of claim 4 wherein:
the bond pad is connected both to the fiducial and to other circuitry of the integrated circuit.

6. The apparatus of claim 3 wherein:
the doped portion is shaped as a square having a side approximately 15 µm long.

7. The apparatus of claim 3 wherein:
the doped portion is shaped as a square.

8. The apparatus of claim 2 wherein:
the first type is n-type and the second type is p-type.

9. The apparatus of claim 8 further comprising:
a bond pad, the bond pad coupled to the contact;
a package, the package enclosing the substrate, the package having a plurality of leads, a first lead of the plurality of leads coupled to the bond pad.

10. The apparatus of claim 9 further comprising:
a sensor coupled to the first lead, the sensor measuring a photo-induced current from the fiducial when exposure of the fiducial to a light results in the photo-induced current.

* * * * *